(12) United States Patent
McManus et al.

(10) Patent No.: US 7,051,308 B2
(45) Date of Patent: May 23, 2006

(54) METHOD AND APPARATUS FOR INTEGRATED CIRCUIT DESIGN WITH LIBRARY CELLS

(75) Inventors: Michael J. McManus, Liberty Township, OH (US); Billie J. Rivera, San Jose, CA (US); Richard Talburt, Sunnyvale, CA (US); William G. Walker, Saratoga, CA (US); Michael A. Zampaglione, San Jose, CA (US)

(73) Assignee: Virtual Silicon Technology, Inc., Sunnyvale, CA (US)

(*) Notice: Subject to any disclaimer, the term of this patent is extended or adjusted under 35 U.S.C. 154(b) by 0 days.

(21) Appl. No.: 10/162,120

(22) Filed: Jun. 3, 2002

(65) Prior Publication Data

US 2003/0023935 A1   Jan. 30, 2003

Related U.S. Application Data

(60) Provisional application No. 60/295,241, filed on Jun. 1, 2001, provisional application No. 60/295,238, filed on Jun. 1, 2001, provisional application No. 60/295,134, filed on Jun. 1, 2001.

(51) Int. Cl.
   *G06F 17/50*   (2006.01)
(52) U.S. Cl. .............................. 716/9; 716/10; 716/11; 716/12
(58) Field of Classification Search ............... 716/1–2, 716/8–15
   See application file for complete search history.

(56) References Cited

U.S. PATENT DOCUMENTS

| | | | | |
|---|---|---|---|---|
| 5,220,490 A | * | 6/1993 | Weigler et al. | 361/777 |
| 6,308,307 B1 | * | 10/2001 | Cano et al. | 716/8 |
| 6,308,309 B1 | * | 10/2001 | Gan et al. | 716/8 |
| 6,421,819 B1 | * | 7/2002 | Masukawa | 716/19 |
| 6,430,734 B1 | * | 8/2002 | Zahar | 716/12 |
| 6,467,074 B1 | * | 10/2002 | Katsioulas et al. | 716/8 |
| 6,539,530 B1 | * | 3/2003 | Torii | 716/12 |
| 6,725,439 B1 | * | 4/2004 | Homsinger et al. | 716/12 |

FOREIGN PATENT DOCUMENTS

| | | |
|---|---|---|
| DE | 43 27 290 A1 | 5/1994 |
| EP | 1 065 721 A2 | 1/2001 |
| JP | 60-034036 | 2/1985 |
| WO | WO 99/28973 A1 | 6/1999 |

\* cited by examiner

*Primary Examiner*—Paul Dinh
(74) *Attorney, Agent, or Firm*—Sierra Patent Group, Ltd.

(57) ABSTRACT

Methods are apparatuses are disclosed for library cells for designing an integrated circuit. Various embodiments cover one or more of virtual buses; virtual tap cells; placement primarily for electrical coupling to a well or substrate; placement at a granularity level of electrical coupling to a well or substrate; metal substantially octagonal via structures; free placement according to a minimum drawing resolution of significant features, cell boundary vertices, and routing wires; and cells permitting overlap.

15 Claims, 19 Drawing Sheets

METHOD AND APPARATUS FOR INTEGRATED CIRCUIT DESIGN WITH LIBRARY CELLS

CROSS REFERENCE TO RELATED APPLICATIONS

This application claims the benefit of U.S. Provisional Application No. 60/295,241, filed Jun. 1, 2001; U.S. Provisional Application No. 60/295,238, filed Jun. 1, 2001; and U.S. Provisional Application No. 60/295,134, filed Jun. 1, 2001. These applications are incorporated herein by reference.

BACKGROUND

Architectures for standard cell libraries, as well as gate array libraries, have become fairly standard over the years. Most common architectures employ first level power buses that run continuously through the cell. An example of such a cell is shown in FIG. 1, where the power rails, 101 and 102 run along the top and bottom edge of the cell. The individual cells, 100 and 103, are placed adjacent to one another so that the power rails, 101 and 102, run continuously from one end of the cell row to the other. In the event that there is a gap in the cell row, the bus is made to be continuous either by use of a filler cell or by routing a wire through the gap. This power bus can be called an "explicit bus" since each cell is explicitly connected to each other cell by the actual placement of the cell itself.

The cell rows themselves are tied together in a grid using other levels, as shown in FIG. 2. The first layer busses, 110, are strapped vertically in a second level using a wider bus, 111. The second level is, in turn, strapped less frequently horizontally by a third layer using an even wider bus, 112, and so on. In this structured approach, each bus of a given layer typically has the same width, regardless of the power requirements of a given section of the grid.

In FIG. 3, a more complete definition of the common standard cell library architecture is given. Fixed width power busses, 120, run in first level along the top and bottom edge of the cell. These cells are referred to as "gridded cells" because they are built on a "construction grid", 122, which is typically defined at the via-to via or via-to-wire spacing for the technology. This construction grid is on the order of several times the gate length of the technology used, typically from 2 to 4 times the drawn gate length. The gridded cell must have most features, including port locations, 121, and cell boundary box, 123, lie on the fixed construction grid. In some cases, these restrictions can make a given cell larger or more difficult to connect to than a cell built without using any type of construction grid.

In most standard cell libraries, the contents of the cells must lie entirely within the cell to avoid creating illegal interactions with adjacent cells. This is illustrated in FIG. 4. Two cells, 130, are placed next to one another, 138, by placing their boundary boxes, 134 and 139, adjacent to one another. The power busses, 131 and 137, join together and become continuous. However, the source diffusion areas in the center, 133 and 135, and the source contacts, 132 and 136, cannot be shared, even though they are electrically connected to the same net.

In FIG. 5, examples of standard cells are shown, 140, which contain "tap contacts". These are electrical connections either to the well, as in 142, or to the substrate, as in 143. These ties electrically couple the appropriate power bus, 141, to the respective well or substrate. While this is an electrical requirement, to include the tap contacts in the cells themselves can use valuable space and make the cell larger or limit the device sizes that can be drawn in the cells.

SUMMARY

Some embodiments include one or more cells. The one or more cells can have one or more virtual buses. The one or more cells are for an integrated circuit design. The one or more virtual buses include a plurality of ports. The plurality of ports represent a common power signal. The plurality of ports include at least two power ports on a same layer. The at least two power ports can be separated by substantially insulating material in the same layer.

Some embodiments include one or more cells. The one or more cells can have one or more virtual buses. The one or more cells are for an integrated circuit design. The one or more virtual buses include a plurality of ports. The plurality of ports share a common power signal. The plurality of ports include at least two power ports on a same layer. The at least two power ports can be separated by substantially insulating material in the same layer. The at least two power ports can be coupled together via one or more electrical paths on one or more layers of metal.

In various embodiments, the common power signal includes a fixed voltage signal. After the at least two power ports are coupled together by one or more electrical paths, the plurality of ports representing the common power signal can share the common power signal.

In various embodiments, an integrated circuit of the integrated circuit design is formed by one or more of a CMOS process, a Bi-CMOS process, a bipolar process, a Gallium-Arsenide process, and a Silicon-on-Insulator process.

In various embodiments, the one or more cells can include one or more of: at least one standard cell, at least one gate array cell, at least one analog cell, at least one analog mixed signal cell, at least one analog and digital cell, and at least one functional block cell.

Some embodiments include one or more virtual tap cells. The one or more virtual tap cells are for an integrated circuit design. The one or more virtual tap cells include one or more electrical couplings. The one or more electrical couplings couple to at least one of: one or more wells and one or more substrates. At least one electrical coupling of the one or more electrical couplings is positioned entirely outside one or more hierarchies of the one or more virtual tap cells.

Some embodiments can be characterized by one or more of the following: the at least one of the one or more taps is placed physically entirely in one of the one or more virtual tap cells, the at least one of the one or more taps is placed physically partly in one of the one or more virtual tap cells, the at least one of the one or more taps is placed physically partly in one of the one or more other cells, the at least one electrical coupling is positioned physically on top of the one or more virtual tap cells, and the at least one electrical coupling is positioned physically between at least two of the one or more virtual tap cells.

Some embodiments include one or more cells. The one or more cells are for an integrated circuit design. The one or more cells are adapted to have a software tool perform placement of one or more features of the integrated circuit design.

In some embodiments, the placement of at least one of the one or more features occur primarily to place one or more electrical couplings to one or more wells and/or substrates.

In some embodiments, the placement of at least one of the one or more features occur at a granularity level of one or more electrical couplings to one or more wells and/or substrates.

In some embodiments, the software tool includes a router.

Some embodiments include one or more cells. The one or more cells are for an integrated circuit design. The one or more cells having one or more ports. The one or more ports can be adapted to couple to one or more metal substantially octagonal via structures.

In some embodiments, the one or more octagonal via structures comprises a square via cut and/or a rectangular via cut.

Some embodiments include one or more cells. The one or more cells are for an integrated circuit design. Comprised are significant features including at least one of: signal ports, power ports, and one or more boundaries of the one or more cells. The significant features are freely placed according to a minimum drawing resolution.

In some embodiments, the minimum drawing resolution corresponds to a layout grid.

In various embodiments, the significant features include signal ports, power ports, and/or one or more boundaries of the one or more cells.

Some embodiments include one or more arbitrarily shaped cells. The one or more arbitrarily shaped cells are for an integrated circuit design. A boundary of the arbitrarily shaped cells includes vertices. The vertices are freely placed according to a minimum drawing resolution.

Some embodiments include one or more cells. The one or more cells are for an integrated circuit design. At least one of the one or more cells includes at least one of: one or more standard cells, and one or more gate array cells. The one or more cells are designed to be substantially coupled by one or more routing wires. The one or more routing wires are freely placed according to a minimum drawing resolution.

Some embodiments include one or more cells. The one or more cells are for an integrated circuit design. The one or more cells have one or more ports clipped by an angle. The angle can be about 45 degrees.

Some embodiments include a first plurality of one or more cells and a second plurality of one or more cells. The first plurality of one or more cells and the second plurality of one or more cells are for an integrated circuit design. The first plurality of one or more cells has a first plurality of one or more structures on one or more edges of the first plurality of one or more cells. The first plurality of one or more cells is adapted to be positioned by the second plurality of one or more cells. The second plurality of one or more cells has a second plurality of one or more structures on one or more edges of the second plurality of one or more cells. At least one structure of the first plurality of one or more structures overlaps at least one structure of the second plurality of one or more structures.

DETAILED DESCRIPTION

Figure 1:
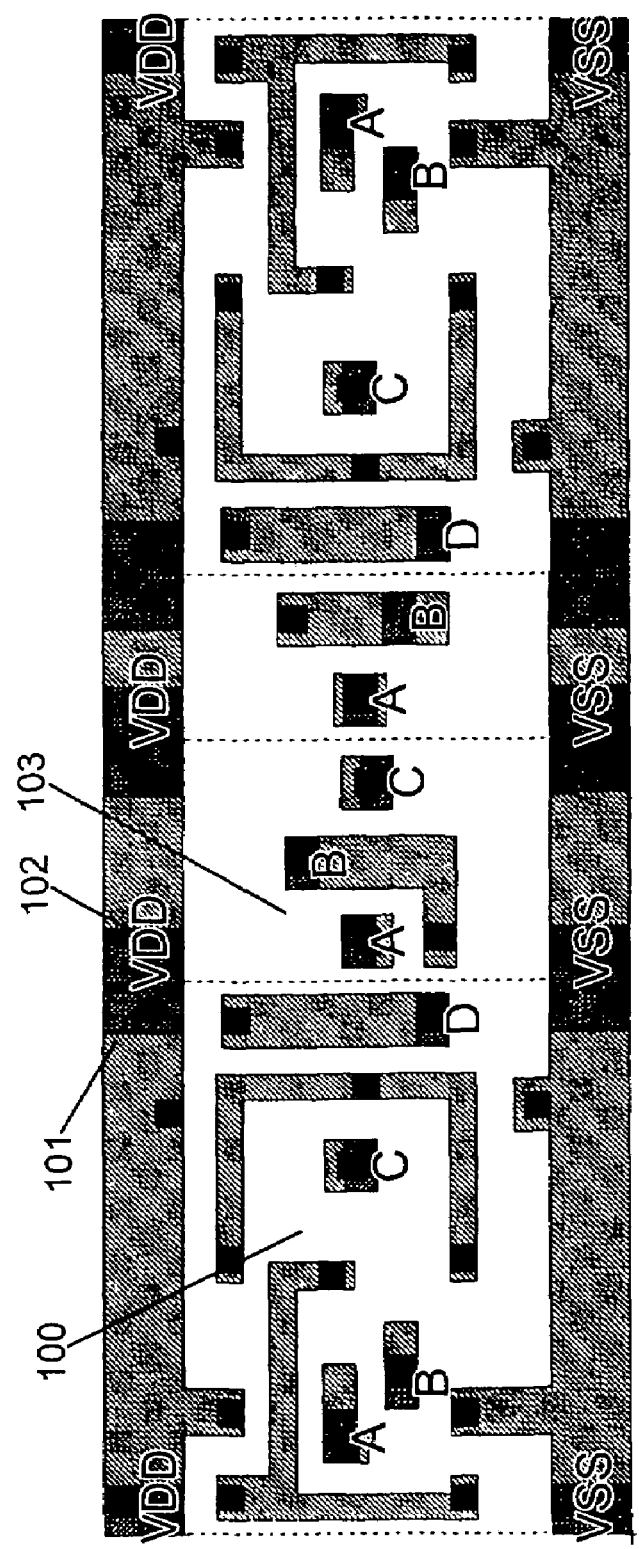
FIG. 1 is an illustration of the traditional method of connecting cell library power buses by abutment.
Figure 2:
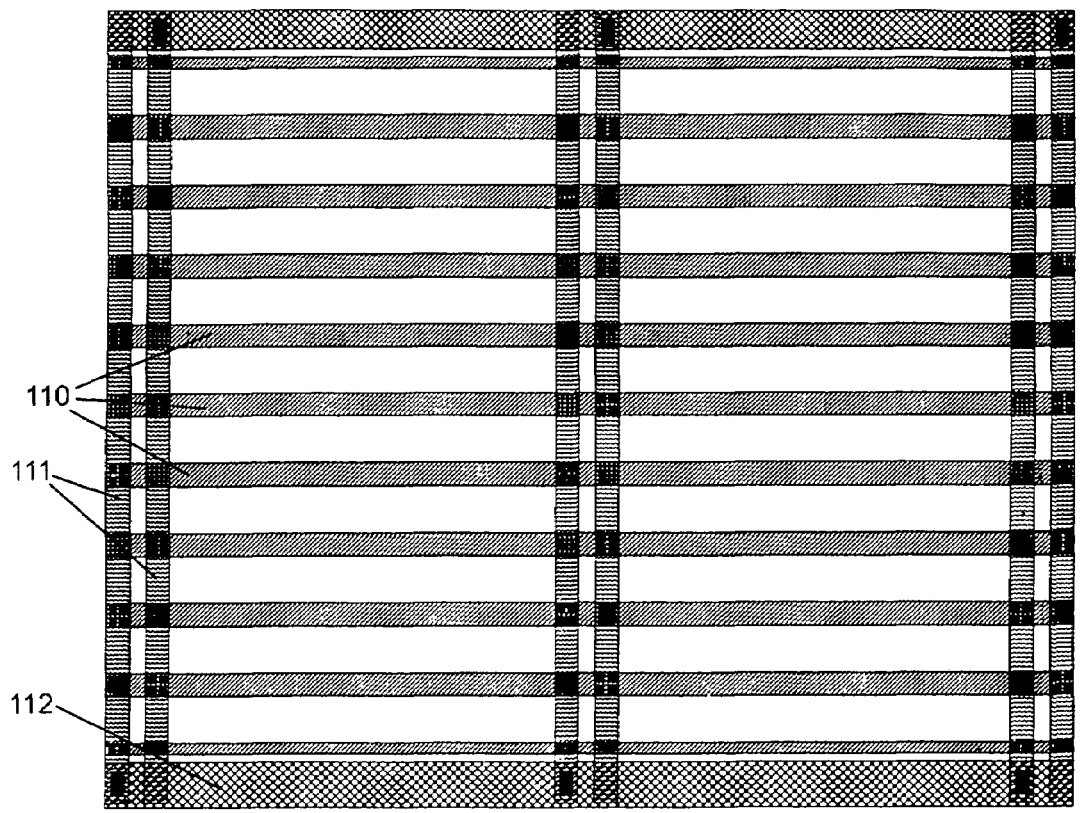
FIG. 2 is an illustration of the traditional method of constructing a global power grid for cell libraries.
Figure 3:
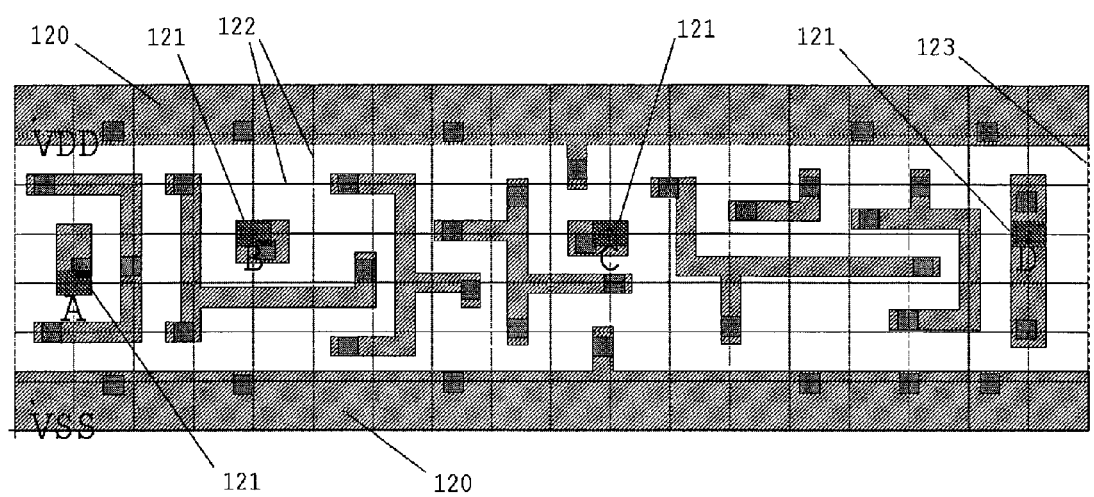
FIG. 3 is an example of a gridded cell that uses a construction grid.
Figure 4:
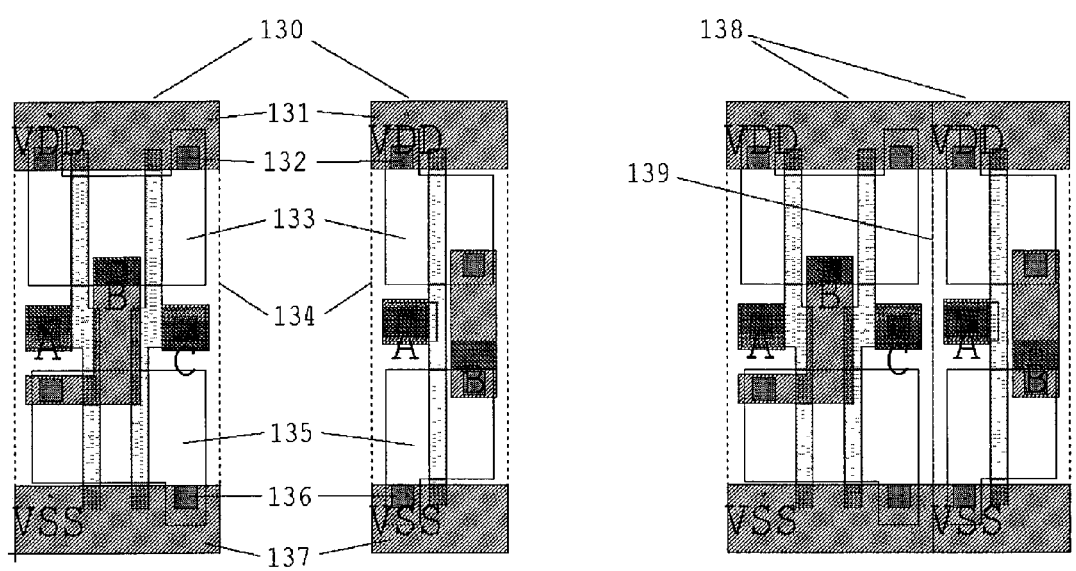
FIG. 4 is an illustration of cells which cannot share source connections at the cell boundary.
Figure 5:
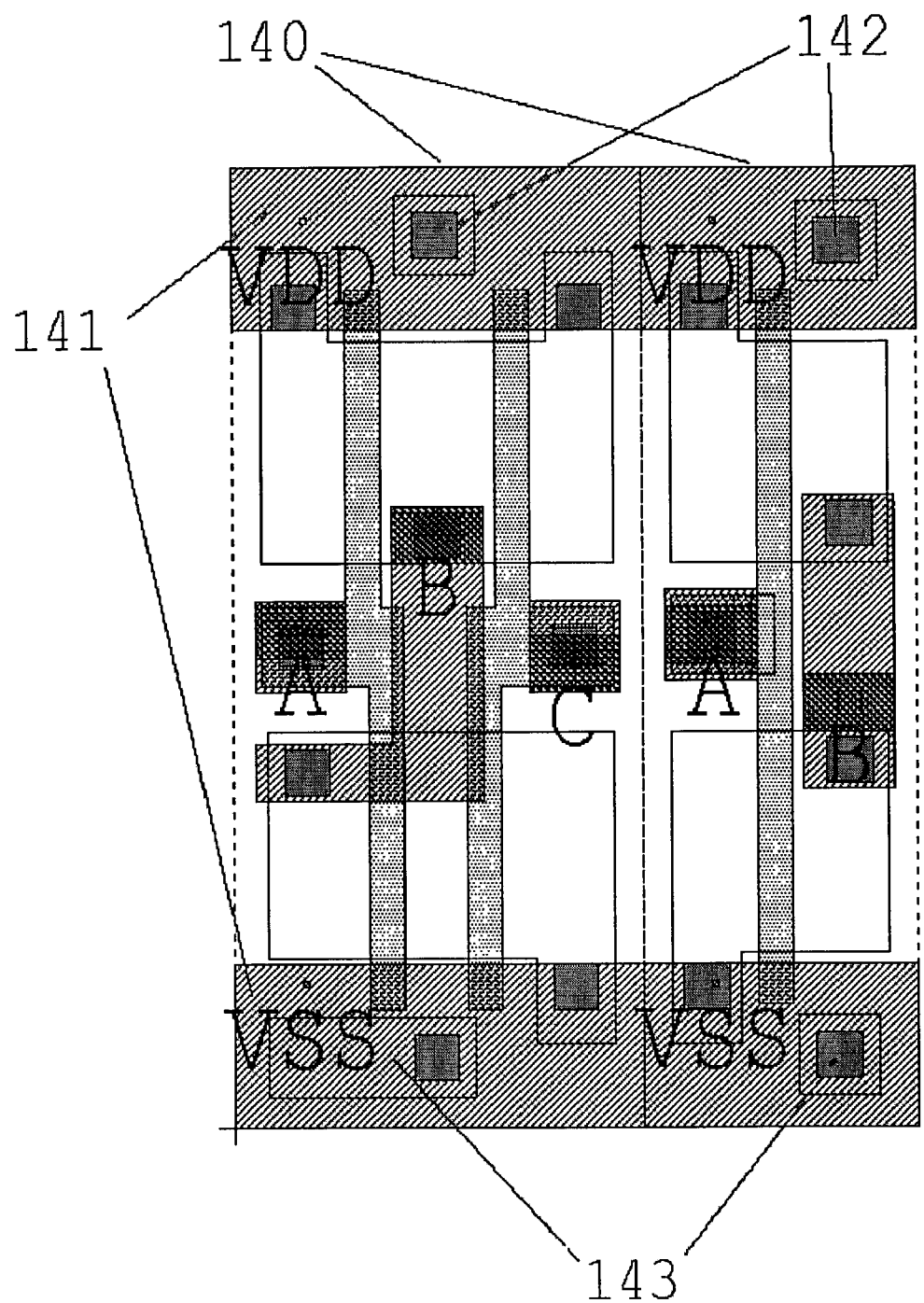
FIG. 5 is an example of cells which contain taps for well and substrate connections.

Some embodiments include a cell library. Other embodiments include a routing tool adapted to work with the cell library. Yet other embodiments include an integrated circuit designed with the cell library and/or routing tool.

One embodiment of a cell includes a basic functional block. Another embodiment of a cell includes one or more transistors designed to perform a specific function. Some embodiments of cells are standard cells, gate array cells, sea of gates cells, logic block cells, analog cells, analog digital cells, analog mixed signal cells, functional block cells, and/or macro cells. One or more of these embodiments can be included in a architecture. The architecture can include one or more of the following features.

Various embodiments can be used in one more semiconductor manufacturing processes, such as CMOS, Bi-CMOS, bipolar, gallium arsenide, and/or silicon on insulator.

Some embodiments use a bus. In some embodiments, a bus describes a metal interconnect line that can be used at least partly, or primarily, to route a power and/or ground connection to a cell. Some embodiments include one or more of the following buses: power, VDD, VCC, VBB, VSS, ground, and/or GND. In some embodiments, a bus can include a fixed voltage supply signal.

Some embodiments include octagonal vias and/or octagonal contact structures. A via and contact can be used in a semiconductor manufacturing process to perform an electrical connection between two or more physical layers. For example, a contact can make an electrical connection between a metal layer such as a metal1 layer and a polysilicon layer. For example, a via can make an electrical connection between a metal3 layer and a metal4 layer, and so on.

A via and a contact are most always a square or rectangular opening in a manufacturing process. In some embodiments, an octagonal via structure consists of a square or rectangular via surrounded by octagonal metal layers. The advantage of the octagonal metal structure is to allow more freedom and space for the router to place metal lines at 45 degree angles.

In some embodiments, the interconnecting signal and/or power ports can be optimized by utilizing circular and/or stop-sign (octagonal) shaped ports, contacts, and/or vias in the cells and/or by the router. By "chamfering" the corners of the signal and/or power ports in the cell, and/or inter-layer contacts, the required spacing to adjacent metal wires running at various angles, for example 90 and/or 45 degrees, can be minimized.

In some embodiments, the use of minimally-sized signal ports and/or power ports can allow the router flexibility in the placement of connecting and/or coupling vias, and/or maximize the "empty" space in the cells for use by the router. In some embodiments, design rules sets may not allow for minimum and/or stand-alone metal features that can be as small as a contact and/or via. To meet the minimum area rules, in some embodiments, the octagonal and/or circular metal features can be stretched into an elongated octagon and/or circle with an area that can meet the minimum allowed metal area in design rules. In some embodiments, the area's width can be a minimum, and/or the length can be sized as needed.

In some embodiments, the metal porosity of the cells can be maximized. Empty space for the router can be left, for example, with as much area as possible void of metal.

In some embodiments, the hierarchy of a cell includes the total plurality of objects contained within the cell, such that the plurality of objects may be referred to, and used as, a single object. If a feature is contained within the cell hierarchy, then when the cell is placed, referenced, and/or used, so is that feature. Each time the cell is used is placed, referenced, and/or used, the feature will have the same relative placement and orientation with respect to the other features in the cell hierarchy. If a feature is outside of the hierarchy of the cell, then that feature does not get placed, referenced, and/or used when the cell is placed, referenced and/or used.

Some embodiments include a virtual bus. One embodiment of a cell may not include an integrated power bus supply and/or a reference voltage structure. Some embodiments include a power port. With some embodiments, a port can be used by a router to make a physical connection to signals in the cell. Prior to being coupled together via one or more electrical paths, two or more ports can represent a common power signal. After being coupled together via one or more electrical paths, the two or more power ports can share the common power signal. Power and/or ground reference (and/or other voltage references) can be coupled to the cells other than through a standard structure that is identical in each cell. In some embodiments, the router can make power connections at variable angles to the cell, for example at 0, 45, and/or 90 degrees, relative to the cell power ports. Different router embodiments can have different variable angle capabilities. Some router embodiments can make such couplings or connections with routed connections or couplings to the chip power rails. In some embodiments, power ports may not be required to be placed in the same relative position within each cell. Cells may contain one or more such power ports, in any layer of metal. In one embodiment, the first level metal can be that layer.

When the router couples the power pins of the cells to the chip power rails, some embodiments couple several cells in a local cluster to the power rails using lower levels of metal, such as the lowest levels of metal. Several clusters can be coupled together to form larger groups, for example with higher levels of metal. The groups can be coupled together, until the entire chip has power connections. In doing the power routing, in some embodiments the router can size the power supply lines to each cell in an optimal way, making the coupling and/or connection just large enough to supply current to the each cell. In some embodiments, this can be true for sizing the cluster and/or group connections and/or couplings. The resulting net in some embodiments can have wide trunk wires, narrower branch wires, and/or many or most narrow connections going to the individual cells, or leaves of the net. Less optimal power routing strategies can be used in other embodiments.

In some embodiments, removing the power bus from the cell can result in reduced cell height, and/or reduced cell area.

In some embodiments, more free space can be provided for metal levels, such as the first level metals, with routing inside the cells.

Some embodiments can have, increased metal level porosity, such as first level metal porosity, over the cell, increased routing capability, and/or efficiency to the signal ports and/or power ports. For example, a metal level, such as the first level metal, can run vertical wires and/or horizontal wires to adjacent cells above and/or below without being blocked by the power bus. In some embodiments, the router can make the power connections and/or couplings. In some embodiments, one or multiple power nets can be use in one or multiple voltage domain designs. In some embodiments, the cells can be mixed in the same cell block. In some embodiments, with low-power designs, sections of logic can be powered off.

In some embodiments, lesser implementations can use a metal level, such as second level metal, or a higher level metal, as the power bus metal. Increased metal level porosity, such as first level metal porosity, may be allowed for.

Some embodiments include "gridless" cells. In some embodiments, one or more cells may not use a macro-level, construction grid reference structure for pin placement and/or cell bounding box. Some or all signal ports and/or power ports can be located off grid, without reference to a construction grid. Some gridless cell embodiments are placed according to a minimum drawing resolution, for example the layout grid. In some embodiments, the cell width and/or height can be made as short and/or as narrow as possible without regard to the construction grid. Some embodiments include arbitrarily shaped cells. For example, not only rectangles but arbitrary shapes can be used. In some embodiments, the cell height and width may not be a multiple of the construction grid. In some embodiments, the ports may not be on the construction grid.

In some embodiments, a more efficient layout, and/or smaller cells can be produced. The size of the cell may not need to be rounded up to a multiple of the construction grid.

In some embodiments, greater freedom can be allowed in the placement of port vias.

Some embodiments can use a standardized, structure on the cell boundaries. Such structures can be overlapped and/or shared by adjacent cells, for example, on the top, bottom, and/or sides. In some embodiments, the standardized structure may be symmetric about the cell boundary. In some embodiments, the router may drop in a spacer between cells where the standard structure cannot be shared.

In some embodiments, these structures can be used on the left and/or right sides of the cell, and/or can include power connections or couplings to diffusion, which can be used in the cells as a source contact. Adjacent cells in some embodiments can share that structure for source contacted devices adjacent to the cell edge. In some embodiments, devices can be placed closer to the cell edge than would be allowed by a half-spacing rule methodology. Standard structures may be used on the top and/or bottom of the cells.

In some embodiments, half diffusion spacing may not be needed on some cell edges, making for smaller cells. In some embodiments, the number of power connections and/or couplings can be minimized to be made at the chip and/or cluster level.

Some embodiments include virtual tap cells. In some embodiments, substrate and/or well taps (such as electrical contacts to the bulk material) may not be an integrated part of the cell structure. They can be smaller by eliminating tap contacts that can be found in the cells. By having the router place taps as requested by the design rules (for example, on the order of 5 to 10 cell widths), chip overhead required for taps, and/or overall chip area.

In some embodiments, the router can insert the taps contacts to meet the design rules. In some embodiments, the router can investigate the "free" areas that may be available for placement of individual tap contacts, in and/or among the individual cells, for example after cell placement and/or before the power routing. In some embodiments, small areas can be formed between adjacent cells that can accommodate placement of such a tap contact, which may otherwise be "wasted" space.

In some embodiments, tap contacts can be inserted by supplying a dedicated tap cell. The dedicated tap cell is an example of a feature whose placement occurs primarily to place one or more electrical couplings to one or more wells and/or substrates. Other embodiments can include just one or more vias and/or contacts. In some embodiments, the tap cell can get placed on intervals between the cells. In some embodiments, the tap cell can allow the router to establish substrate and/or well connections as part of the router's task of routing and placing cells. In some embodiments, the router can place the taps as requested by the design rules. In some embodiments, the router may not place as many as would result from the inclusion of the tap contacts within the individual cells.

In some embodiments, once the tap contacts are placed, for example, as individual contacts and/or as a tap cell, the router can connect them to the appropriate power rails. In some embodiments, one or more taps can be routed to a separate net, which may be tied to an alternate power rail and/or a set of rails. In some embodiments, this can be useful, for example, where the substrate connection from certain logic sections can be isolated. In some embodiments this can minimize the propagation of power supply noise from one section of logic to another. In other embodiments for performance and/or test purposes, a back-bias voltage can be provided to the substrate and/or well that can be a different voltage than the voltage provided by standard power rails.

In some embodiments the router can analyze the layout post-placement for places where individual tap contacts can be placed within the abutting cell regions. In some embodiments, this can result in no overhead for the tap contact placement. In some embodiments, the cell library can be post-processed to provide available tie sites to the router. In some embodiments, the same scheme can be used for placement of diodes for eliminating antenna rule violations.

In some embodiments, removal of the taps can allow for the potential of routing the taps on a separate supply rail from the digital logic supply rail. In some embodiments, this can isolate digital supply rail noise from analog sections of the chip. In some embodiments, the substrate and/or well bias voltage can be raised above and/or below the normal operating supply rails. In some embodiments, this can be useful for lowering the normal device threshold voltages, and/or the device leakage, during, for example, Iddq, quiescent power supply current, production testing.

Figure 6:
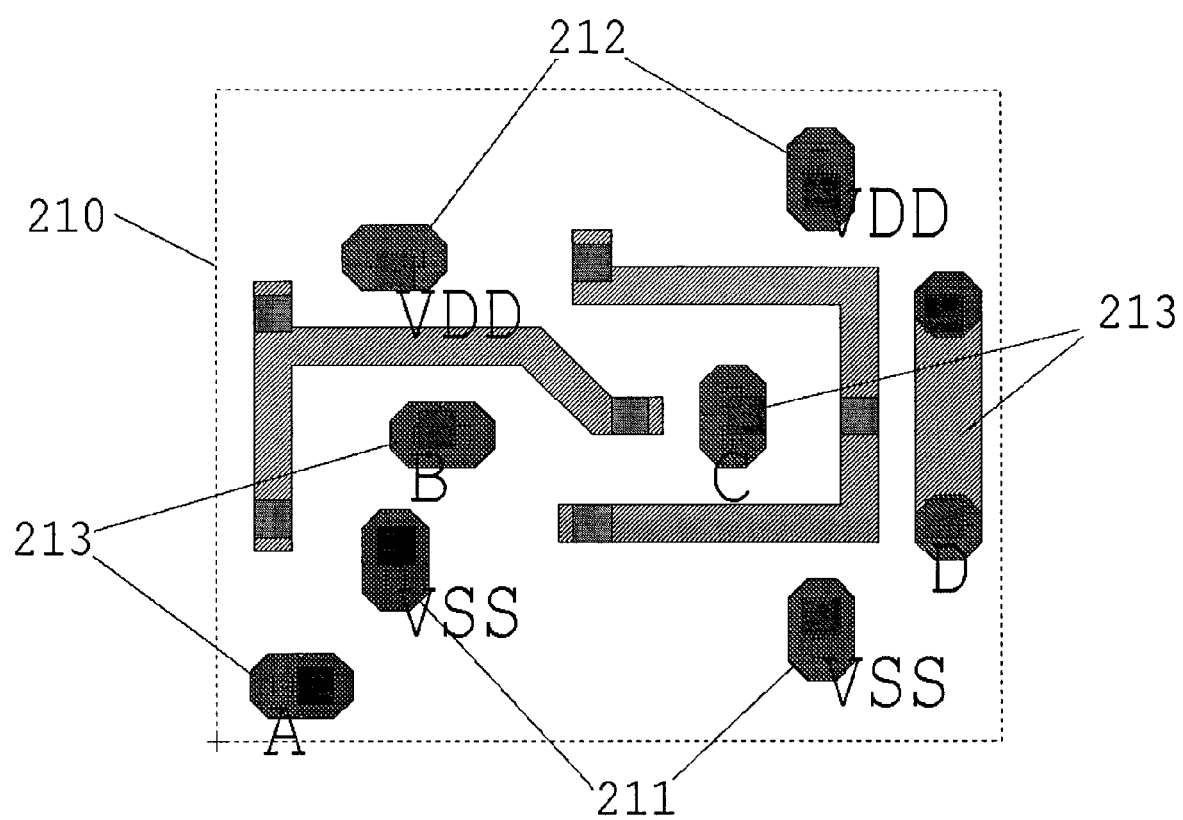
FIG. 6 is an example of a cell showing signal ports, power ports and octagonally shaped ports.
Figure 7:
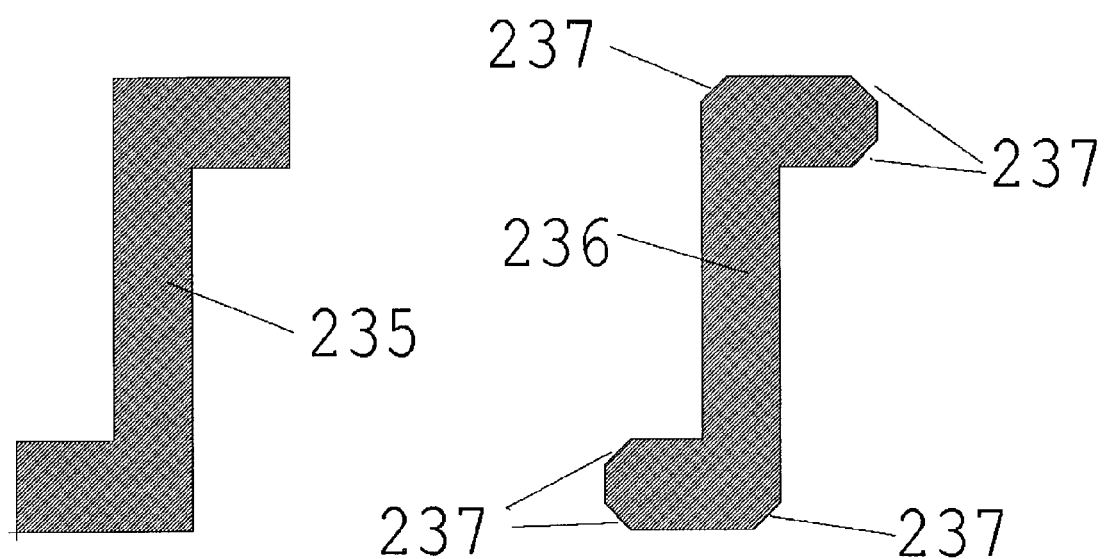
FIG. 7 is an illustration of a rectilinear port and a version of the same port with the corners clipped.

By removing the "explicit" power bus and replacing it with a "virtual" power bus, the availability for connecting to other ports within a cell in greatly enhanced. FIG. 6 shows an example of this type of cell, 210. The virtual power bus is composed of power ports 211 and 212. In some embodiments, the signal ports, 213, and power ports can be drawn as octagonal structures to maximize the ability of the router to run non-orthogonal wires through the cell. In some embodiments, the signal ports and power ports can be drawn as polygons with clipped corners, which approximate octagonal structures at the corners, to maximize the ability of the router to run non-orthogonal wires through the cell. FIG. 7 illustrates this embodiment by showing a rectilinear port, 235, and then a version of the same port, 236, with the corners clipped, 237.

Figure 8:
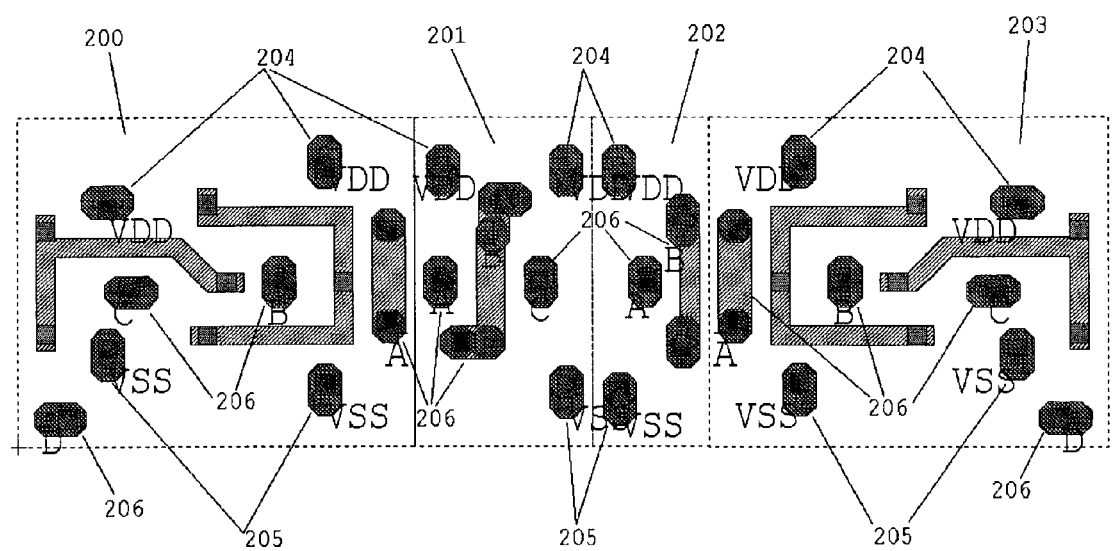
FIG. 8 illustrates how cells in a virtual bus cell library might look when placed in a cell row.
Figure 9:
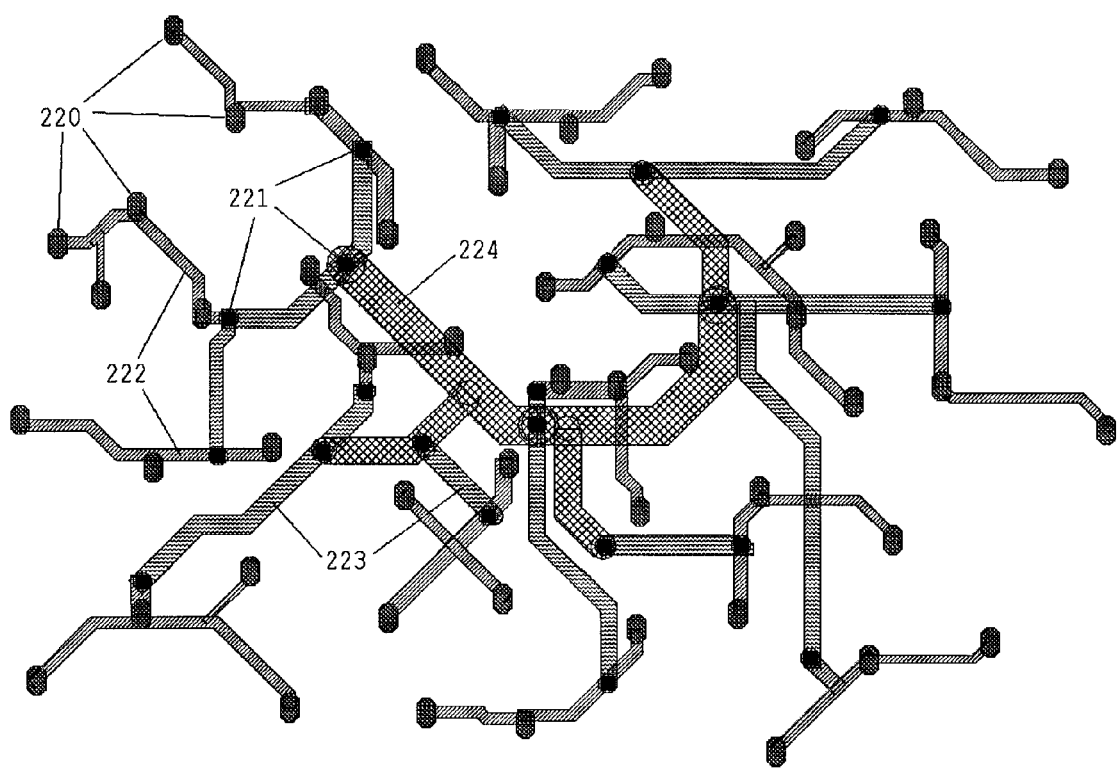
FIG. 9 illustrates how power ports may be connected to one another in a virtual bus cell library.

In FIG. 8, the cell style of FIG. 6 is used to build a row of cells, 200, 201, 202 and 203. Power ports, 204 and 205, make up a virtual power bus that will be connected together in upper levels as shown in FIG. 8. Prior to being coupled together via one or more electrical paths, power ports 204 and 205 represent a common power signal. After being coupled together via one or more electrical paths, power ports 204 and 205 share the common power signal. Local power ports, 220, are connected using the lowest power level, 222, and relatively narrow wires. The first layer busses, 222, are then connected in various directions in a second or higher level, using wider bus, 223 (interlayer vias shown as 221). The second level, 223, is, in turn, connected by a third higher layer using an even wider bus, 224, and so on. In some embodiments of this non-structured wiring approach, the individual branches of the power bus may be sized according to the exact power requirements of those cells in the branch. Some embodiments can have one more instances where a higher layer has a narrower bus than a lower layer.

Figure 10:
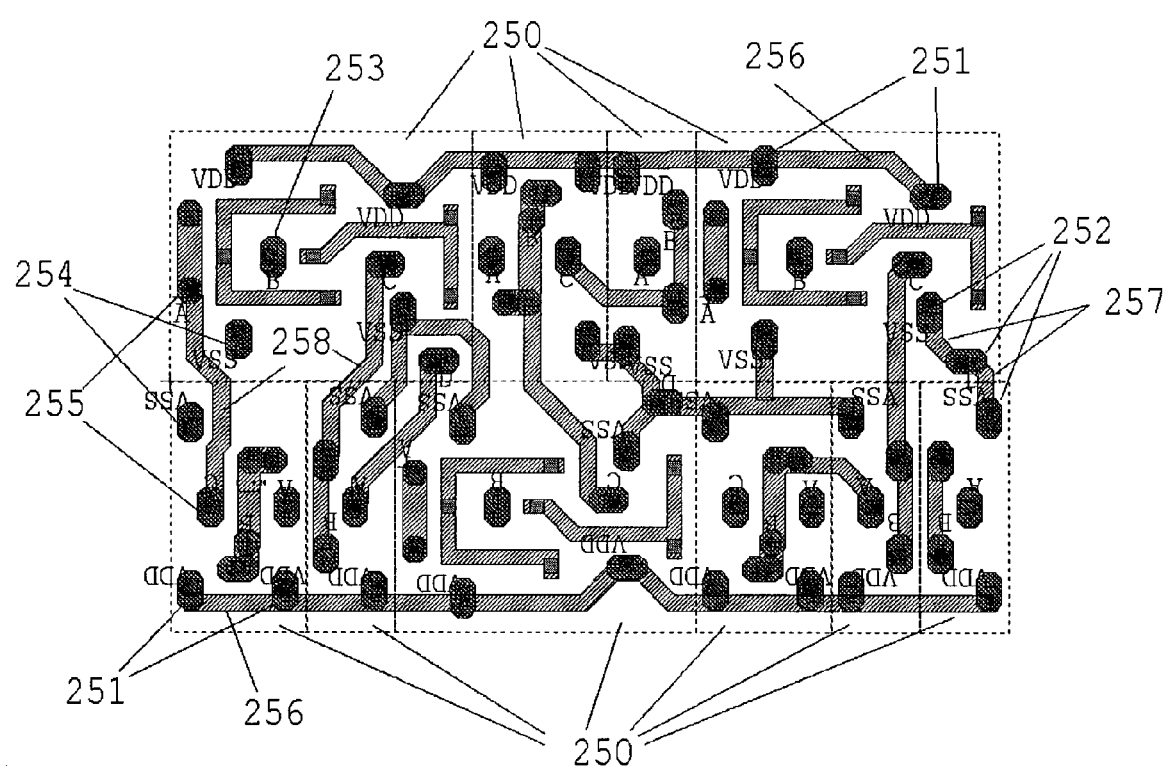
FIG. 10 illustrates unobstructed interconnections in lowest level between power ports and signal ports when utilizing a virtual bus cell library.

FIG. 10 illustrates that when cells using the virtual power bus architecture are placed into cell rows, 250, many of the power ports, 251 and 252, can be connected to one another in the lowest level, 256 and 257. Some power ports, such as 254, cannot be connected in lowest level and must be connected by higher level. In a similar manner, because the fixed power busses do not present blockages, some signal ports, such as 255, can be connected locally across the cell rows in lowest level, 258. Other signal ports, such as 253, must be connected in higher levels.

Figure 11:
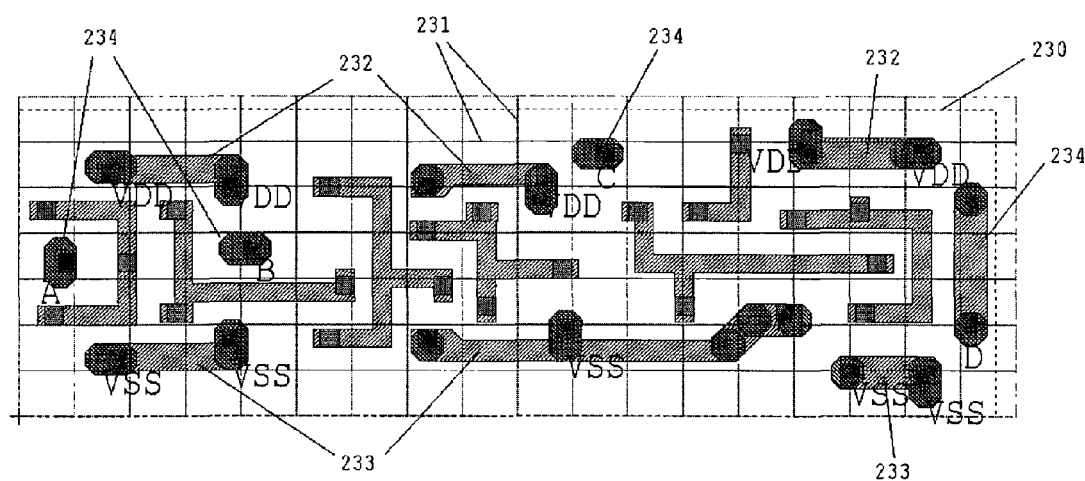
FIG. 11 is an example of a gridless cell that does not use a construction grid.

By drawing the cells without regard to any type of construction grid, such as shown in FIG. 11, the cell area and ability to connect to ports may be optimized. Common features such as the cell boundary, 230, power ports, 232 and 233, and signal ports 234, are placed as needed without regard to any type of construction grid, as shown by 231 for reference. In this "gridless" cell architecture, all objects may be drawn on the much smaller drawing grid, which is typically one or two orders of magnitude smaller than the size of the construction grid.

Figure 12:
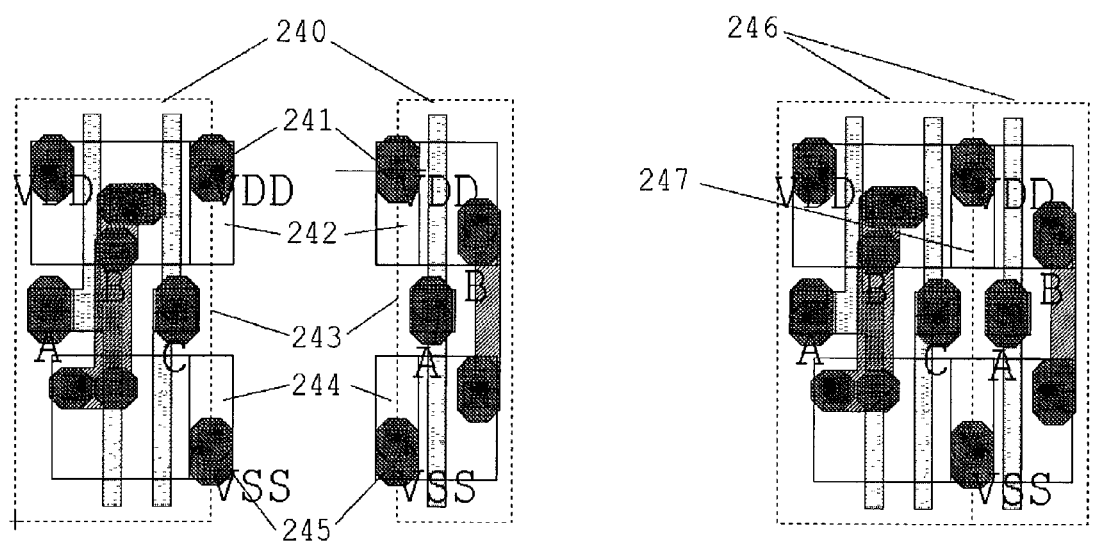
FIG. 12 illustrates how a cell library may be built to share power connections using a common building style.

The example in FIG. 12 shows a cell library architecture where the cells, 240, are built with a common, identical structure on the edge of the cell. The source diffusion, 242 and 244, as well as the source contacts and power ports, 241 and 245, are placed in the same location in every cell, straddling the cell boundary 243. When two such cells are placed adjacent to one another, 246, they will share the source diffusion and source contact(s), resulting is a smaller total area for the two cells.

Figure 13:
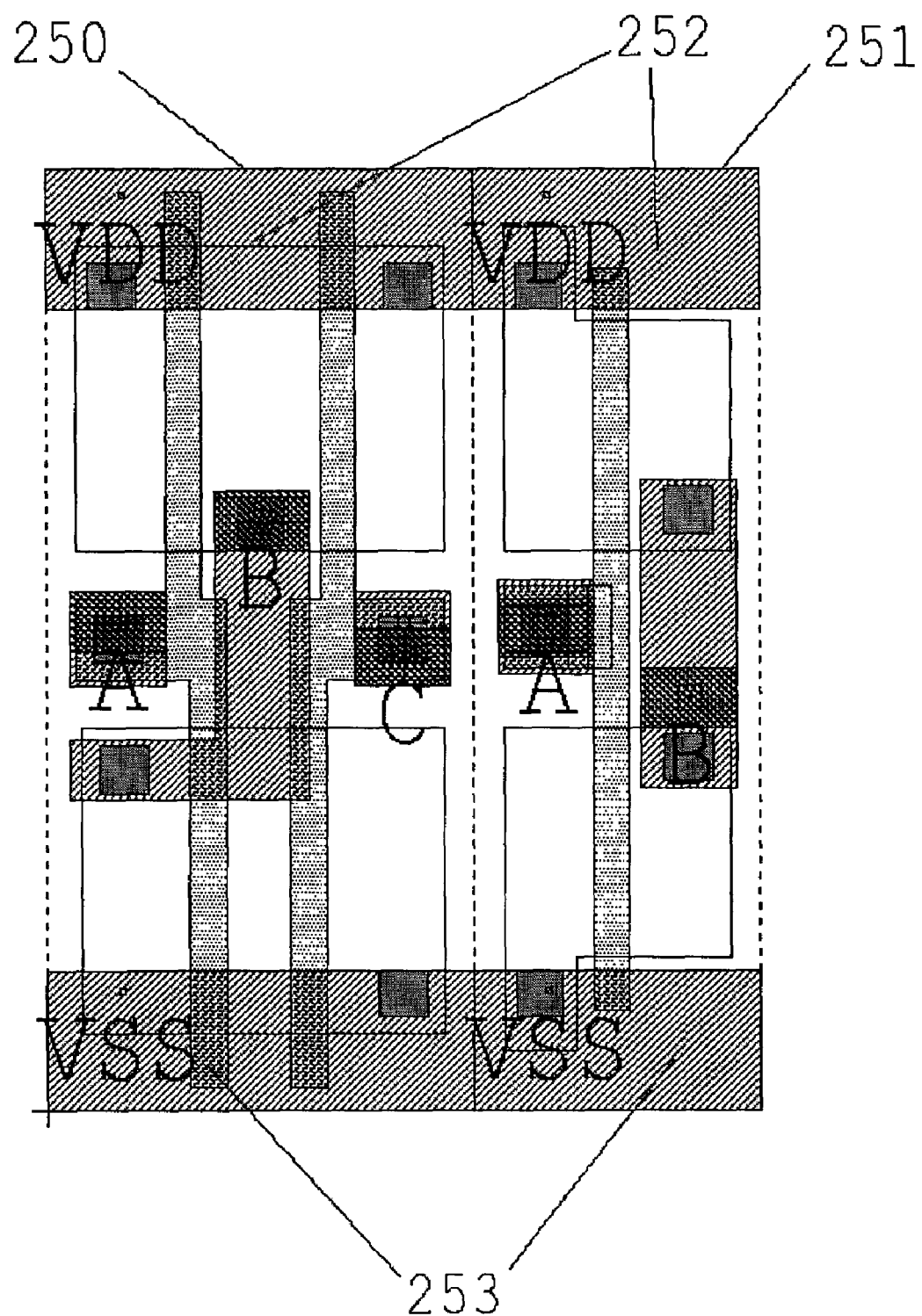
FIG. 13 is an example of a virtual tap cell library, since it does not contain connections to the well or substrate.
Figure 14:
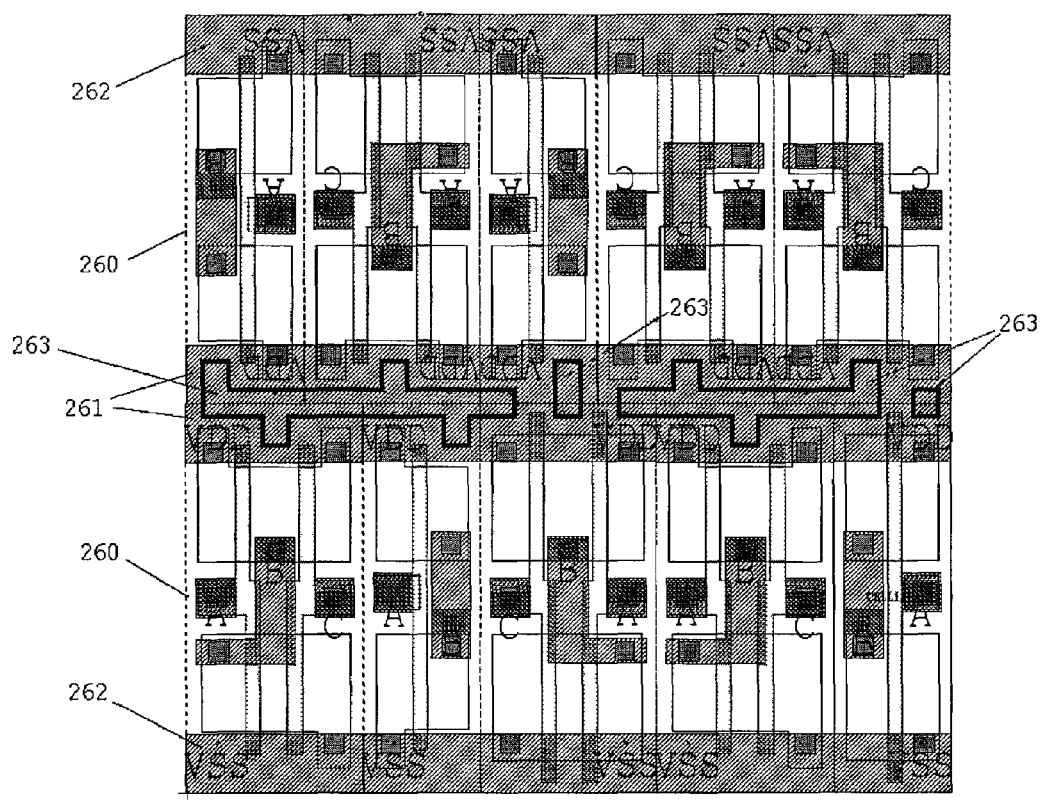
FIG. 14 illustrates a virtual tap cell library with traditional power bus that has been placed into cell rows, with available locations for potential tap placements identified.
Figure 15:
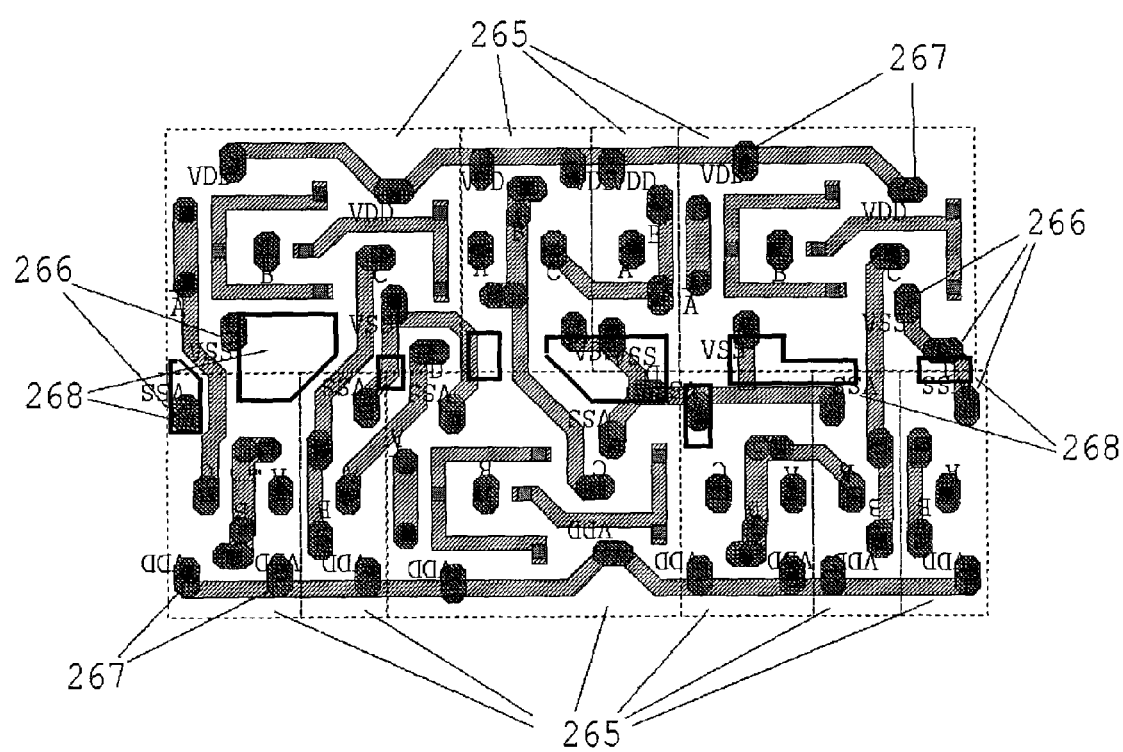
FIG. 15 illustrates a virtual tap cell library with virtual power bus that has been placed into cell rows, with available locations for potential tap placements identified.

FIG. 13 shows examples of two cells, 250 and 251, which do not contain substrate or well connections (called "taps") to the power rails, 252 and 253, and so are referred to as virtual tap cells. These cells can be smaller and/or use larger device widths than cells which contain tap contacts. In FIG. 14, the cells from FIG. 13 are placed into cell rows. This array of virtual tap cells, 260, happens to be built using a cell architecture with an explicit power bus, 261 and 262. The highlighted region 263 shows the area into which individual tap connections to the well can legally be placed. A similar example could be shown for placement of substrate contacts. FIG. 15 also shows an array of virtual tap cells, 265, but with the virtual power bus architecture, indicated by the presence of power ports, 266 and 267. The highlighted region 268 shows the area into which individual tap connections to the cell can legally be placed. As before, a similar example could be shown for placement of substrate contacts.

Figure 16:
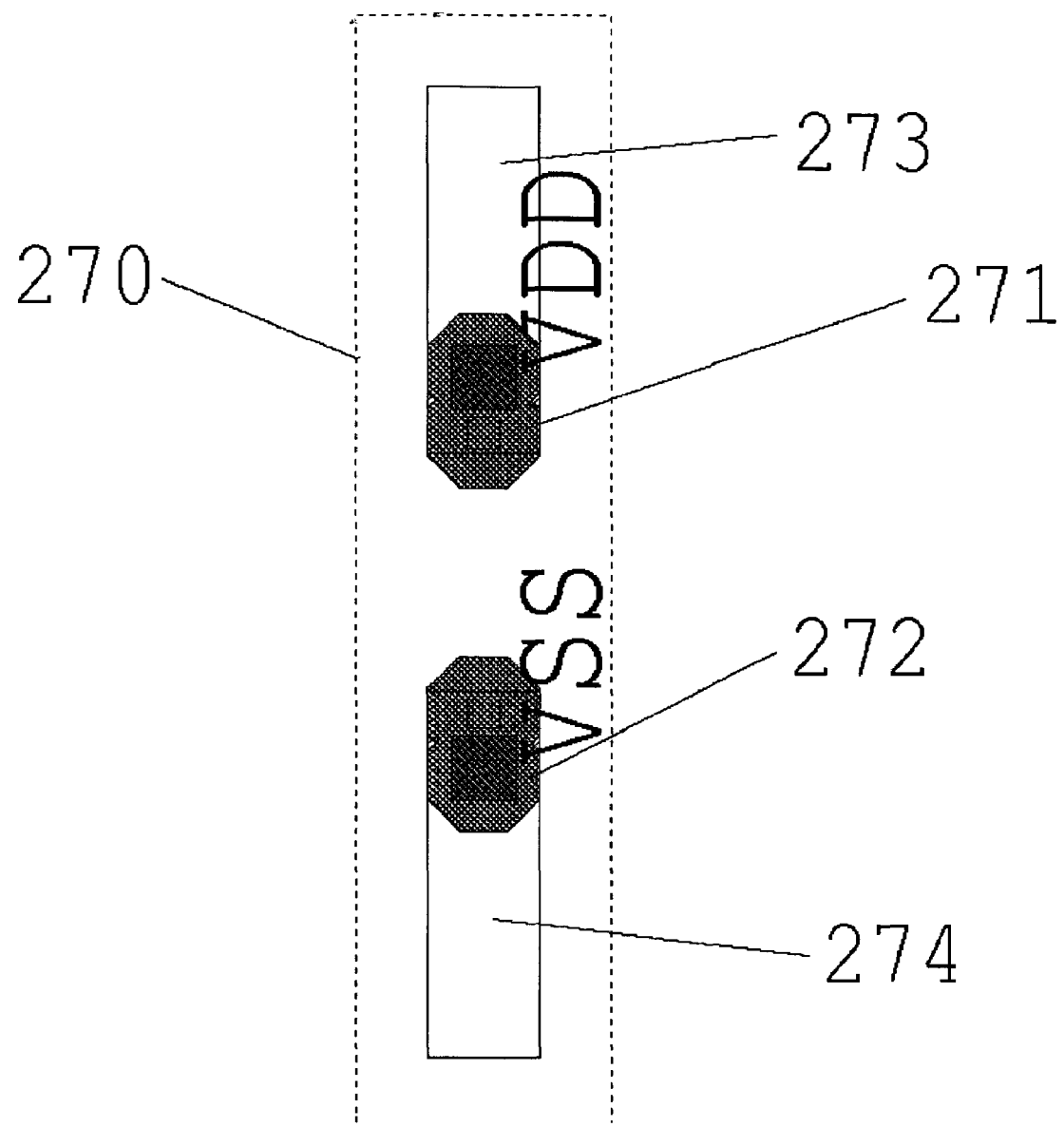
FIG. 16 is an example of a tap cell that can be used to provide well and substrate connections.

An alternative to placing individual tap contacts is to use a dedicated tap cell as part of the library, as shown in FIG. 16. In this example, the cell, 270, includes power ports, 271 and 272, as well as taps to both well, 273, and substrate, 274. Other embodiments have just electrical couplings to the well or just electrical couplings to the substrate. Other embodiments have just vias and/or contacts.

Figure 17:
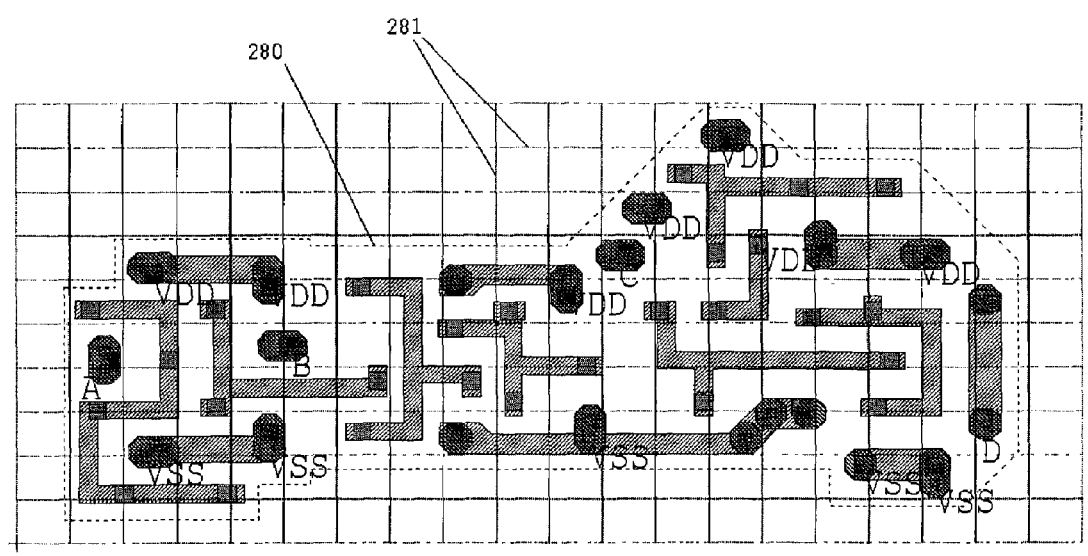
FIG. 17 is an example of a cell with an arbitrary shape.
Figure 18:
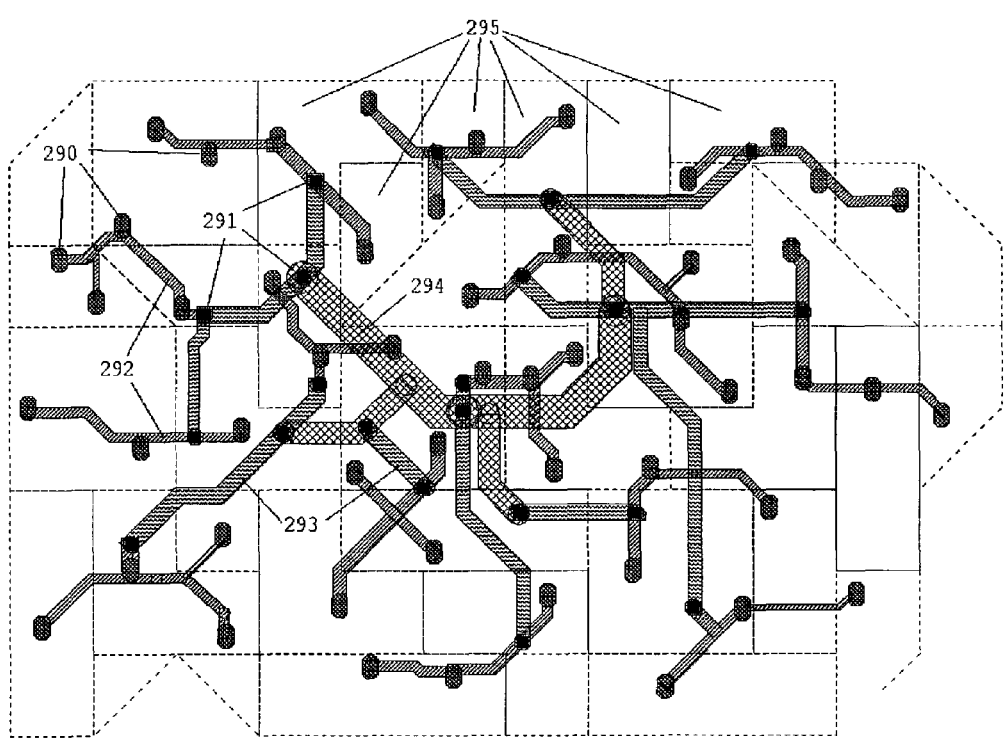
FIG. 18 illustrates how power ports may be connected to one another in a virtual bus cell library that uses arbitrary shapes for the cells.

FIG. 17 shows a cell with an arbitrary shape, where not only are the major features not on any type of construction grid, 281, but the cell boundary 280 is a polygon with an arbitrary, non-rectangular shape. FIG. 18 shows how these arbitrarily shaped cells, 295, can be connected using power ports, 290, and various interconnect levels, 291, 292, 293 and 294.

Figure 19:
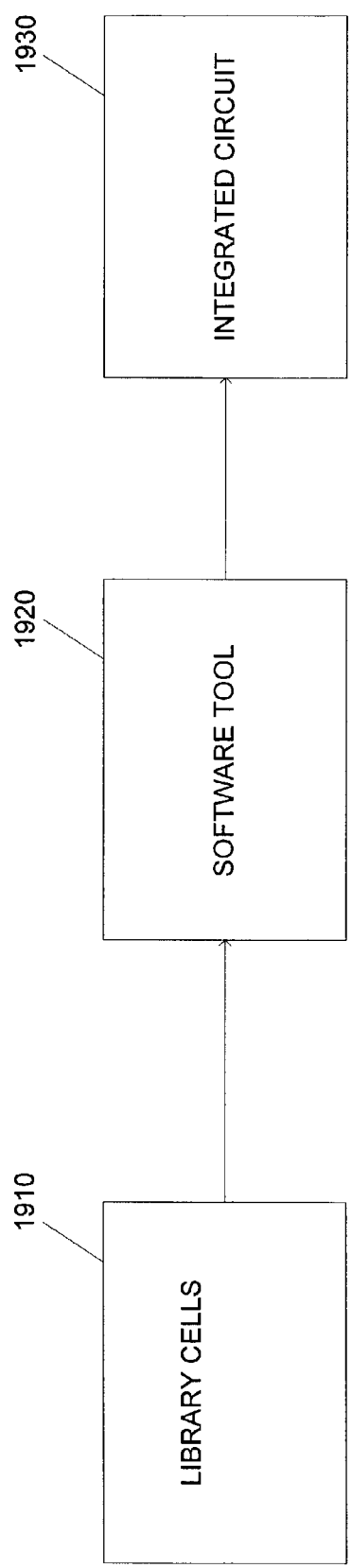
FIG. 19 is a block diagram showing the progression of an integrated circuit design to a finished integrated circuit.

FIG. 19 is a block diagram showing the progression of an integrated circuit design to a finished integrated circuit. Library cells 1910 are processed with a software tool for at least some routing and/or placing 1920. This may be a router. The design in the end produces an integrated circuit 1930.

One embodiment of a software tool can be a place and route tool, which places and electrically couples cells to one another.

Another embodiment of a software tool can be a place and route tool, which places and electrically couples cells to one another, in addition to providing a way for coupling taps to the substrate and/or well.

Another embodiment of a software tool can be a routing tool, which electrically couples cells to one another after the cell have been placed.

Another embodiment of a software tool can be a routing tool, which electrically couples cells to one another after the cell have been placed, in addition to providing ways for coupling taps to the substrate and/or well.

Another embodiment of a software tool can be a floor planning tool, which places and electrically couples cell to one another.

Another embodiment of a software tool can be a floor planning tool, which places and electrically couples cell to one another, in addition to providing ways for coupling taps to the substrate and/or well.

Another embodiment of a software tool can be a design verification tool, which analyzes the physical layers of the design database and can modify, add and/or subtract features from the design database.

Another embodiment of a software tool can be a design verification tool, which analyzes the physical layers of the design database and can modify, add and/or subtract features from the design database in order to electrically couple cell to one another.

Another embodiment of a software tool can be a design verification tool, which analyzes the physical layers of the design database and can modify, add and/or subtract features from the design database in order to provide a way for coupling taps to the substrate and/or well.

Another embodiment of a software tool can be a design verification tool, which analyzes the physical layers of the design database and can modify, add and/or subtract features from the design database in order to electrically couple cells to one another and to provide a way for coupling taps to the substrate and/or well.

Another embodiment of a software tool can be a layout synthesis tool, which can modify, add and/or subtract features from the layout database.

The invention claimed is:

1. A cell library, comprising:
one or more cells having one or more virtual buses, the one or more cells for an integrated circuit design, wherein the one or more virtual buses comprise:
a plurality of ports representing a common power signal on a first layer, and each of said plurality of ports are positioned on each of said one or more cells without reference to a construction grid and wherein said plurality of ports are connected on a second layer with an absence of connections between said plurality of ports on said first layer.

2. The library of claim 1, wherein the common power signal includes a fixed voltage signal.

3. The library of claim 1, wherein an integrated circuit of the integrated circuit design is formed by a CMOS process.

4. The library of claim 1, wherein an integrated circuit of the integrated circuit design is formed by a Bi-CMOS process.

5. The library of claim 1, wherein an integrated circuit of the integrated circuit design is formed by a Bipolar process.

6. The library of claim 1, wherein an integrated circuit of the integrated circuit design is formed by a Gallium-Arsenide process.

7. The library of claim 1, wherein an integrated circuit of the integrated circuit design is formed by a Silicon-on-Insulator process.

8. The library of claim 1, wherein the one or more cells includes at least one standard cell.

9. A cell library, comprising:
one or more cells having one or more virtual buses, the one or more cells for an integrated circuit design, wherein the one or more virtual buses comprise:
a plurality of ports representing a common power signal on a same layer, the said plurality of ports are coupled together via one or more electrical paths, and each of said plurality of ports are positioned on each of said one or more cells without reference to a construction grid and wherein said one or more electrical paths are on a layer other than said same layer of said plurality of ports and there is an absence of connection between said plurality of ports on said layer of said ports.

10. The library of claim 9, wherein the common power signal includes a fixed voltage signal.

11. The library of claim 9, wherein an integrated circuit of the integrated circuit design is formed by a CMOS process.

12. The library of claim 9, wherein an integrated circuit of the integrated circuit design is formed by a Bi-CMOS process.

13. The library of claim 9, wherein an integrated circuit of the integrated circuit design is formed by a Bipolar process.

14. The library of claim 9, wherein an integrated circuit of the integrated circuit design is formed by a silicon-on-Insulator process."

15. The library of claim 9, wherein an integrated circuit of the integrated circuit design is formed by a Gallium-Arsenide process.

\* \* \* \* \*